United States Patent
Song et al.

(10) Patent No.: US 9,116,429 B2
(45) Date of Patent: *Aug. 25, 2015

(54) RESIST UNDERLAYER POLYMER, RESIST UNDERLAYER COMPOSITION INCLUDING THE SAME, AND METHOD OF PATTERNING USING THE SAME

(75) Inventors: Jee-Yun Song, Uiwang-si (KR); Hwan-Sung Cheon, Uiwang-si (KR); Sung-Wook Cho, Uiwang-si (KR); Kyong-Ho Yoon, Uiwang-si (KR); Min-Soo Kim, Uiwang-si (KR); Seung-Bae Oh, Uiwang-si (KR)

(73) Assignee: CHEIL INDUSTRIES, INC., Gumi-si, Kyeongsangbuk-do (KR)

( * ) Notice: Subject to any disclaimer, the term of this patent is extended or adjusted under 35 U.S.C. 154(b) by 158 days.

This patent is subject to a terminal disclaimer.

(21) Appl. No.: 12/886,808

(22) Filed: Sep. 21, 2010

(65) Prior Publication Data
US 2011/0117501 A1    May 19, 2011

(30) Foreign Application Priority Data
Nov. 13, 2009  (KR) .......................... 10-2009-0109971

(51) Int. Cl.
G03F 7/09    (2006.01)
G03F 7/11    (2006.01)
G03F 7/30    (2006.01)
G03F 7/36    (2006.01)
C08G 61/02   (2006.01)
C08L 65/00   (2006.01)

(52) U.S. Cl.
CPC .............. *G03F 7/091* (2013.01); *C08G 61/02* (2013.01); *C08L 65/00* (2013.01); *G03F 7/11* (2013.01); *G03F 7/30* (2013.01); *G03F 7/36* (2013.01); *C08G 2261/3424* (2013.01); *C08G 2261/45* (2013.01); *C08G 2261/76* (2013.01)

(58) Field of Classification Search
None
See application file for complete search history.

(56) References Cited

U.S. PATENT DOCUMENTS

| 6,936,405 B2 | 8/2005 | Sabnis et al. |
| 7,862,990 B2* | 1/2011 | Yoon et al. ................... 430/323 |
| 7,981,594 B2* | 7/2011 | Yoon et al. ................... 430/323 |
| 8,153,349 B2* | 4/2012 | Cheon et al. .................. 430/313 |
| 8,263,321 B2 | 9/2012 | Yoon et al. |
| 8,445,187 B2 | 5/2013 | Yoon et al. |
| 8,741,540 B2* | 6/2014 | Kim et al. ................... 430/270.1 |
| 2006/0234158 A1 | 10/2006 | Hatakeyama |
| 2008/0160461 A1* | 7/2008 | Yoon et al. ................... 430/323 |
| 2008/0292995 A1 | 11/2008 | Houlihan et al. |
| 2008/0305441 A1* | 12/2008 | Yoon et al. ................... 430/323 |
| 2009/0176165 A1 | 7/2009 | Cheon et al. |
| 2010/0021830 A1 | 1/2010 | Kim et al. |
| 2010/0221657 A1 | 9/2010 | Sakamoto et al. |

FOREIGN PATENT DOCUMENTS

| JP | 62-057413 A | 3/1987 |
| JP | 2006-293207 A | 10/2006 |
| JP | 2009-003162 A | 1/2009 |
| JP | 2010-117629 * | 5/2010 |
| KR | 10 2008-0062963 A | 7/2008 |
| KR | 10-2008-0063243 A | 7/2008 |
| KR | 10-0866015 B1 | 10/2008 |
| KR | 10-2008-0107208 A | 12/2008 |
| KR | 10-2009-0068444 A | 6/2009 |
| TW | 2009-37126 A | 9/2009 |
| WO | WO 2008/082241 A1 | 7/2008 |
| WO | WO 2008/120855 A1 * | 10/2008 |
| WO | WO 2008/150058 A1 | 12/2008 |

OTHER PUBLICATIONS

Eley et al (Chemical Abstract 1968:105621—an abstract for Eley et al "Semiconduction in Phenylene Polymers", Polymer (1968), vol. 9 (3), pp. 159-172).*
JPO English abstract for JP 2010-117629 (2010).*
Machine-assisted English translation for JP 2010-117629, as provided by JPO (2010).*

* cited by examiner

*Primary Examiner* — Sin Lee
(74) *Attorney, Agent, or Firm* — Lee & Morse, P.C.

(57) ABSTRACT

A resist underlayer polymer, a resist underlayer composition including the same, and a method of patterning using the same, the resist underlayer polymer including a repeating unit represented by at least one of Chemical Formula 1 and Chemical Formula 2:

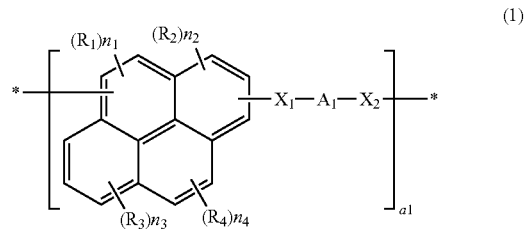

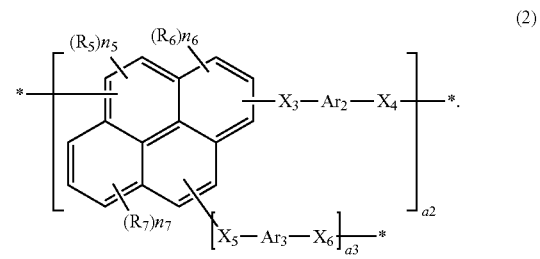

18 Claims, No Drawings

RESIST UNDERLAYER POLYMER, RESIST UNDERLAYER COMPOSITION INCLUDING THE SAME, AND METHOD OF PATTERNING USING THE SAME

BACKGROUND

1. Field

Embodiments relate to a resist underlayer polymer, a resist underlayer composition including the same, and a method of patterning using the same.

2. Description of the Related Art

Reducing a size of structural shapes in the microelectronics industry and other related industries, including the manufacture of microscopic structures (e.g., micromachines and magneto-resist heads) has recently attracted attention. In particular, in the microelectronics industry, reducing the size of microelectronic devices in order to provide a greater number of circuits in a given chip size is increasingly desirable. Effective lithographic techniques may be used to achieve a reduction in the size of structural shapes.

A typical lithographic process may involve the following processes. First, a resist coated on an underlying material may be subjected to exposure to radiation to form a resist layer. Thereafter, the resist layer may be subjected to development to provide a patterned resist layer and the underlying material exposed in the patterned resist layer may be etched to transfer a pattern into the underlying material. After transferring the pattern, a photosensitive resist may be subjected to exposure to provide a patterned resist layer. Thereafter, an image may be developed by bringing the exposed resist layer into contact with a certain substance (typically, an aqueous alkaline developing solution). Then, the substance present in openings of the patterned resist layer may be etched to transfer the pattern to the underlying material. After completion of the transfer, remaining portions of the resist layer may be removed.

For better resolution in most lithographic processes, an antireflective coating (ARC) may be used to minimize the reflectivity between a resist layer and an underlying material. However, since many portions of the resist layer may also be removed during etching of ARC after patterning, patterning may be further required in the subsequent etching step.

In other words, in some lithographic imaging processes, the resist may not provide resistance to the etching step to an extent that is sufficient to effectively transfer the desired pattern to an underlying material. In the case where an extremely thin resist layer is required, an underlying material to be etched is thick, a large etching depth is needed, or the use of a particular etchant is required depending on the type of underlying material, a resist underlayer may be used.

The resist underlayer may act as an intermediate layer between the resist layer and the underlying material that may be patterned by transfer from the patterned resist. The resist underlayer should be able to receive the pattern from the patterned resist layer and withstand etching required to transfer the pattern to the underlying material. Although many materials for such an underlayer have been suggested, an improved underlayer composition is needed.

Since conventional underlayer materials may be difficult to apply to substrates, the use of chemical and physical vapor deposition, special solvents, and/or high-temperature baking may be required. However, these methods have a high cost. Thus, an underlayer composition that may be applied by spin-coating techniques without high temperature baking may be desirable. An underlayer composition that may be selectively etched using an overlying resist layer as a mask in an easy manner while being resistant to etching necessary to pattern an underlying metal layer using an underlayer as a mask, may be desirable.

An underlayer composition that provides superior storage life-span properties and avoids unwanted interactions (e.g., acid pollution from a hardmask) with an imaging resist layer may be desirable. An underlayer composition that has particular optical properties against imaging irradiation at short wavelengths (e.g., 157 nm, 193 nm, and 248 nm) may be desirable.

SUMMARY

Embodiments are directed to a resist underlayer polymer, a resist underlayer composition including the same, and a method of patterning using the same, which substantially overcome one or more of the problems due to the limitations and disadvantages of the related art.

It is a feature of an embodiment to provide a polymer having high absorption in a short wavelength region of deep ultraviolet (DUV) rays.

It is another feature of an embodiment to provide a resist underlayer polymer composition that includes the polymer, has high absorption in a short wavelength region of DUV rays, has high etching selectivity, has sufficient resistance against multi-etching, minimizes reflectivity between a resist and an underlayer, and that may be applied using a spin-on coating method.

At least one of the above and other features and advantages may be realized by providing a A resist underlayer polymer including a repeating unit represented by at least one of Chemical Formula 1 and Chemical Formula 2:

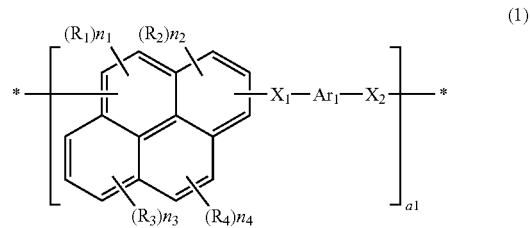

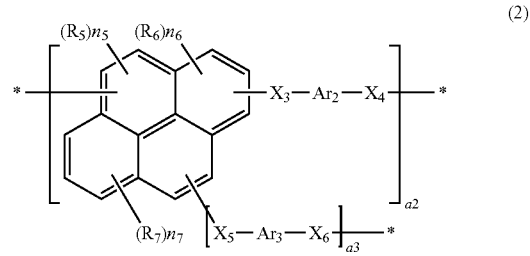

wherein, in Chemical Formulae 1 and 2, $R_1$, $R_3$, $R_4$, $R_5$, and $R_7$ are each independently hydrogen, a hydroxy group, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted carbonyl group, a substituted or unsubstituted amino group, a substituted or unsubstituted siloxane group, or a substituted or unsubstituted silane group, $R_2$ and $R_6$ are each independently hydrogen, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted carbonyl group, a substituted or unsubstituted amino group, a substituted or unsubstituted siloxane group, or a substituted or unsubstituted silane group, $n_1$ to $n_7$ are each independently integers ranging from 0 to 2, and $2 \leq a1 < 100$, $2 \leq a2 < 100$, and $2 \leq a3 < 100$. $Ar_1$ to $Ar_3$ are each independently a functional group derived from an aromatic ring group-containing compound represented by Chemical Formulae 3 to 13:

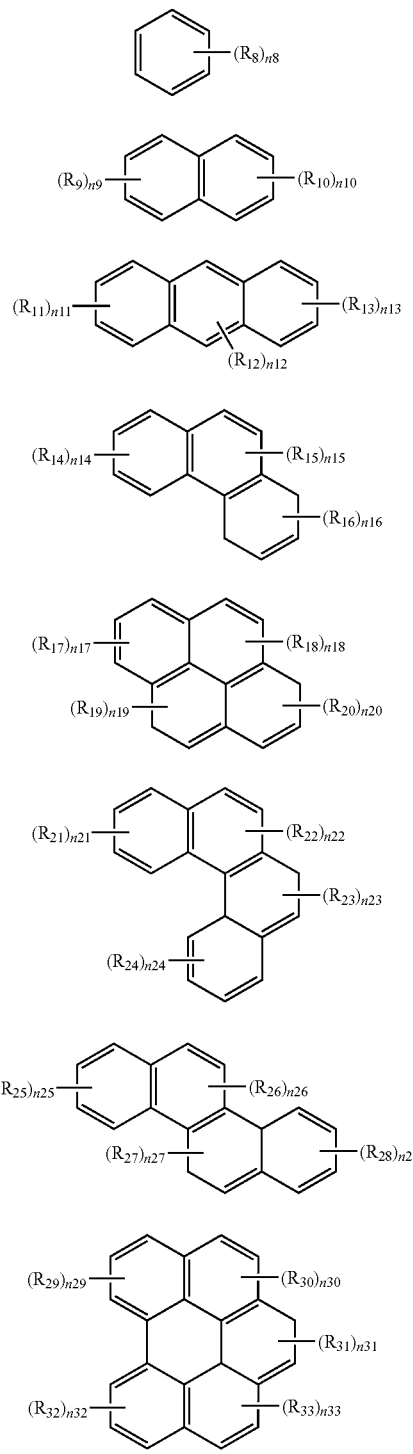

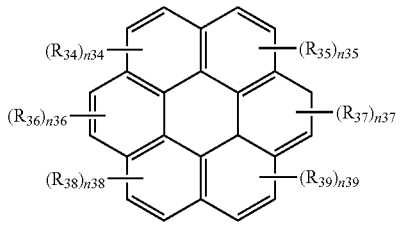

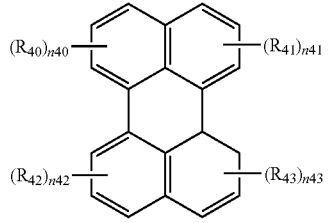

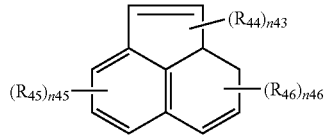

wherein, in Chemical Formulae 3 to 13, $R_8$ to $R_{33}$ and $R_{44}$ to $R_{46}$ are each independently hydrogen, a hydroxy group (—OH), a substituted or unsubstituted alkyl group, a substituted or unsubstituted aryl group, a substituted or unsubstituted alkenyl group, or a halogen, $R_{34}$ to $R_{43}$ are each independently hydrogen, a substituted or unsubstituted alkyl group, a substituted or unsubstituted aryl group, a substituted or unsubstituted alkenyl group, or a halogen, and n8 to n46 are each independently from 0 to k, wherein k equals a number of hydrogen atoms of each aromatic ring group, —$X_1$— to —$X_6$— are each independently a functional group represented by one of Chemical Formulae 14 to 20:

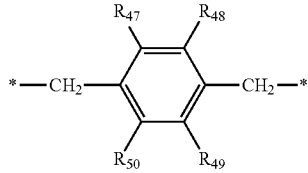

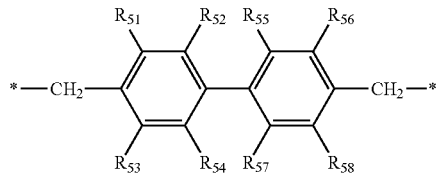

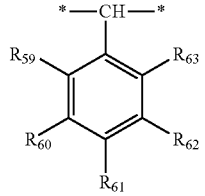

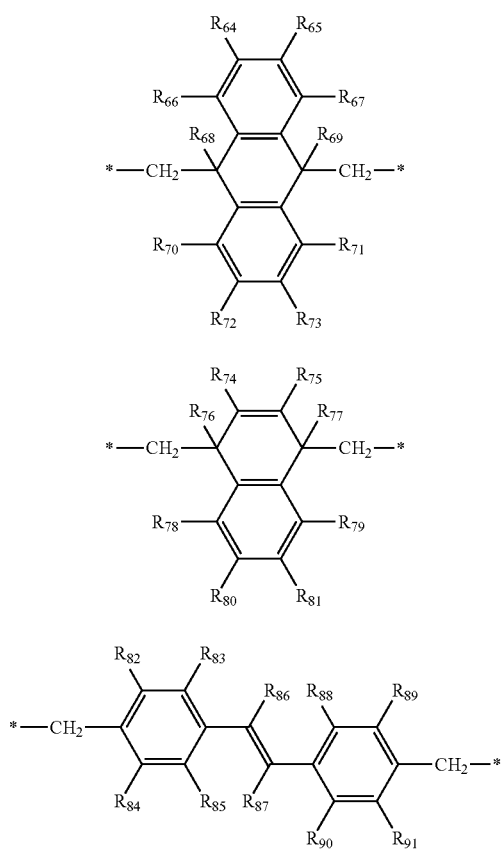

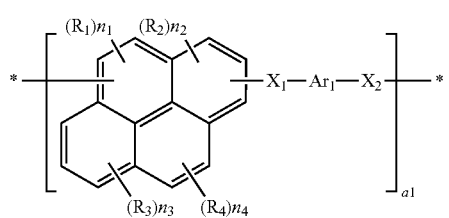

wherein, in Chemical Formulae 14 to 20, $R_{47}$ to $R_{91}$ are each independently hydrogen, a substituted or unsubstituted alkyl group, a substituted or unsubstituted aryl group, a substituted or unsubstituted allyl group, or a halogen.

$R_1$ to $R_7$ may be hydrogen, $Ar_1$ to $Ar_3$ may each independently be a functional group derived from aromatic ring group-containing compounds represented by Chemical Formula 3 or 4, and —$X_1$— to —$X_6$— may each be functional groups represented by Chemical Formula 14.

The polymer may have a weight average molecular weight of 1,000 to 30,000.

At least one of the above and other features and advantages may also be realized by providing a resist underlayer composition including an organic solvent; and a polymer including a repeating unit represented by at least one of Chemical Formula 1 and Chemical Formula 2,

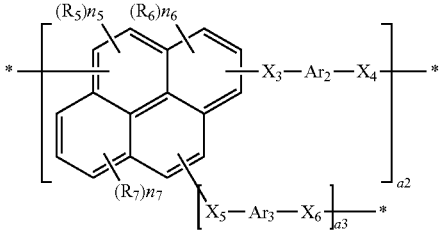

wherein, in Chemical Formulae 1 and 2, $R_1$, $R_3$, $R_4$, $R_5$, and $R_7$ are each independently hydrogen, a hydroxy group, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted carbonyl group, a substituted or unsubstituted amino group, a substituted or unsubstituted siloxane group, or a substituted or unsubstituted silane group, $R_2$ and $R_6$ are each independently hydrogen, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted carbonyl group, a substituted or unsubstituted amino group, a substituted or unsubstituted siloxane group, or a substituted or unsubstituted silane group, $n_1$ to $n_7$ are each independently integers ranging from 0 to 2, and $Ar_1$ to $Ar_3$ are each independently a functional group derived from an aromatic ring group-containing compound represented by Chemical Formulae 3 to 13:

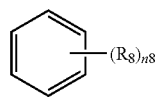

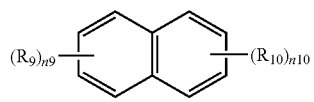

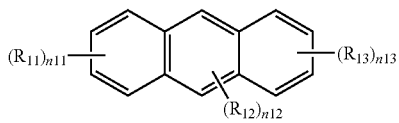

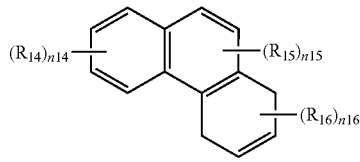

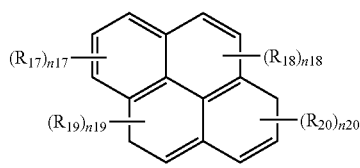

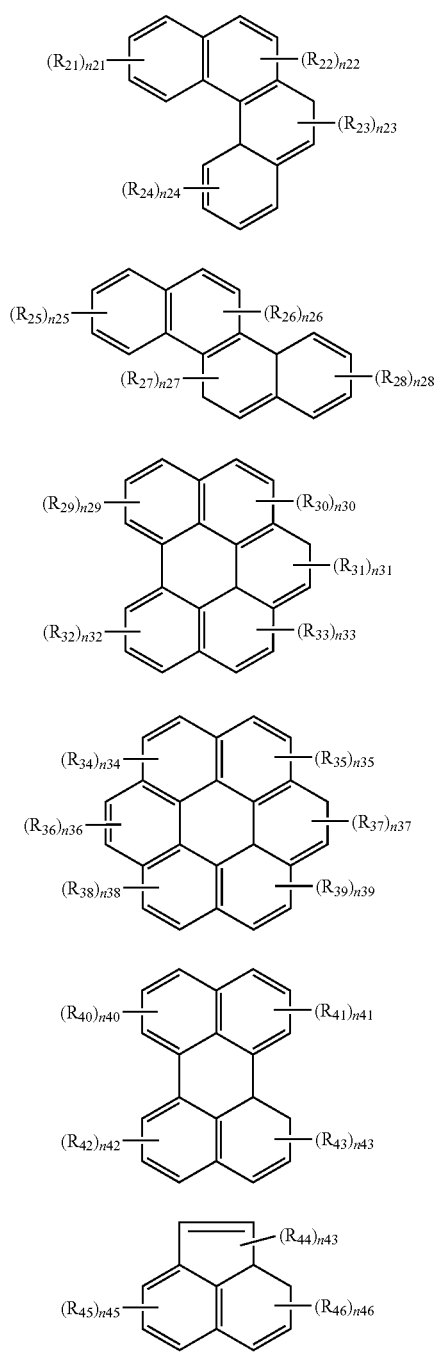

wherein, in Chemical Formulae 3 to 13, $R_8$ to $R_{33}$ and $R_{44}$ to $R_{46}$ are each independently hydrogen, a hydroxy group (—OH), a substituted or unsubstituted alkyl group, a substituted or unsubstituted aryl group, a substituted or unsubstituted alkenyl group, or a halogen, $R_{34}$ to $R_{43}$ are each independently hydrogen, a substituted or unsubstituted alkyl group, a substituted or unsubstituted aryl group, a substituted or unsubstituted alkenyl group, or a halogen, and n8 to n46 are each independently from 0 to k, wherein k equals a number of hydrogen atoms of each aromatic ring group, —$X_1$— to —$X_6$— are each independently a functional group represented by one of Chemical Formulae 14 to 20:

wherein, in Chemical Formulae 14 to 20, $R_{47}$ to $R_{91}$ are each independently hydrogen, a substituted or unsubstituted alkyl group, a substituted or unsubstituted aryl group, a substituted or unsubstituted allyl group, or a halogen.

$R_1$ to $R_7$ may be hydrogen, $Ar_1$ to $Ar_3$ may each independently be a functional group derived from aromatic ring group-containing compounds represented by Chemical Formula 3 or 4, and —X$_1$— to —X$_6$— may be functional groups represented by Chemical Formula 14.

The polymer may have a weight average molecular weight of 1,000 to 30,000.

The polymer may be included in an amount of about 1 to about 30 parts by weight, based on 100 parts by weight of the organic solvent.

The polymer may be included in an amount of about 1 to about 27 parts by weight, based on 100 parts by weight of the organic solvent.

The resist underlayer composition may further include a cross-linking component; and an acid catalyst.

The cross-linking component may include a melamine resin, an amino resin, a glycoluril compound, a bisepoxy compound, or a combination thereof.

The cross-linking component may be included in an amount of about 0.1 to about 5 parts by weight, based on 100 parts by weight of the polymer.

The acid catalyst may include pyridinium p-toluene sulfonate, 2,4,4,6-tetrabromocyclohexadienone, benzointosylate, 2-nitrobenzyltosylate, alkylesters of organic sulfonic acids, or a combination thereof.

The acid catalyst may be included in an amount of about 0.001 to about 0.05 parts by weight, based on 100 parts by weight of the polymer.

The resist underlayer composition may further include a surfactant.

At least one of the above and other features and advantages may also be realized by providing a method for patterning a device, the method including providing a material layer on a substrate; forming a resist underlayer using the resist underlayer composition according to an embodiment on the material layer; forming a resist layer on the resist underlayer; exposing the resist layer on the substrate; developing the exposed substrate; and etching the developed substrate.

The method may further include forming a silicon-containing resist underlayer prior to forming the resist layer.

The method may further include forming a bottom antireflective coating (BARC) on the silicon-containing resist underlayer prior to forming the resist layer.

The method of patterning a device may be a method of manufacturing a semiconductor integrated circuit device.

DETAILED DESCRIPTION

Korean Patent Application No. 10-2009-0109971, filed on Nov. 13, 2009, in the Korean Intellectual Property Office, and entitled: "Resist Underlayer Polymer, and Resist Underlayer Composition and Method of Patterning Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, the term "alkyl group" refers to a $C_{1-10}$ linear or branched alkyl group, the term "aryl group" refers to a $C_{6-20}$ aryl group, the term "allyl group" refers to a $C_{3-10}$ allyl group, e.g. alkylallyl group, alkenylallyl group, arylallyl group, aminoallyl group, halogenated allyl group, the term "alkenyl group" refers to a $C_{2-10}$ alkenyl group, the term "alkoxy group" refers to a $C_{1-20}$ alkoxy group, the "carbonyl group" refers to a $C_{1-20}$ carbonyl group, e.g. aldehyde group, alkylcarbonyl group, alkenylcarbonyl group, arylcarbonyl group, aminocarbonyl group, halogenated carbonyl group, and the term "halogen" refers to F, Cl, Br, or I. The term "siloxane group" refers to SiR$^a$R$^b$R$^c$O—, where R$^a$, R$^b$, and R$^c$ are independently an alkyl group, an alkoxy group, an allyl group, or an alkenyl group As used herein, when a definition is not otherwise provided, the term "substituted" refers to one substituted with at least one substituent of a halogen (F, Cl, Br, or I), a hydroxy group, a nitro group, a cyano group, an amino group (—NH$_2$, —NH(R), —N(R''')(R''''), (where R''' and R'''' are independently a $C_{1-10}$ alkyl group), an amidino group, a hydrazine or hydrazone group, a carboxyl group, a silane group, a substituted or unsubstituted $C_{1-10}$ alkyl group, a substituted or unsubstituted $C_{6-20}$ aryl group, a substituted or unsubstituted $C_{3-20}$ cycloalkyl group, a substituted or unsubstituted $C_{3-20}$ cycloalkenyl group, a substituted or unsubstituted $C_{3-20}$ heteroaryl group, or a substituted or unsubstituted $C_{2-20}$ heterocycloalkyl group instead of at least one hydrogen in a functional group.

As used herein, when a definition is not otherwise provided, the term "hetero" refers to one substituted with at least one of N, O, S, or P instead of carbon.

An embodiment provides a polymer having a repeating unit represented by at least one of the following Chemical Formula 1 and Chemical Formula 2. In an implementation, the polymer according to an embodiment may include a repeating unit represented by Chemical Formula 1 and a repeating unit represented by the following Chemical Formula 2.

When the polymer includes repeating units represented by both Chemical Formula 1 and Chemical Formula 2, a ratio of repeating units represented by Chemical Formula 1 to repeating units represented by Chemical Formula 2 may be appropriately adjusted according to desired physical properties. For example, when the polymer includes repeating units represented by both Chemical Formula 1 and Chemical Formula 2, the ratio of the two repeating units may be about 1:99 wt % to about 99:1 wt %.

A polymer including a repeating unit represented by Chemical Formula 1 and/or a repeating unit represented by Chemical Formula 2 may include an aromatic ring having high absorption in a short wavelength region of DUV rays, e.g., at 248 nm. Thus, reflectivity may be minimized and high etch-resistance may be achieved.

Also, the aromatic ring of the polymer may be positioned within a frame portion of the polymer. The aromatic ring may absorb radiation having a short wavelength, e.g., 193 nm and/or 248 nm, during a lithographic process to thereby minimize reflectivity without an additional anti-reflective coating when the polymer prepared according to an embodiment is used in a resist underlayer composition.

Also, the resist underlayer composition according to present embodiment may have a coating characteristic of forming a layer through a conventional spin coating process; and may form a film after a baking process.

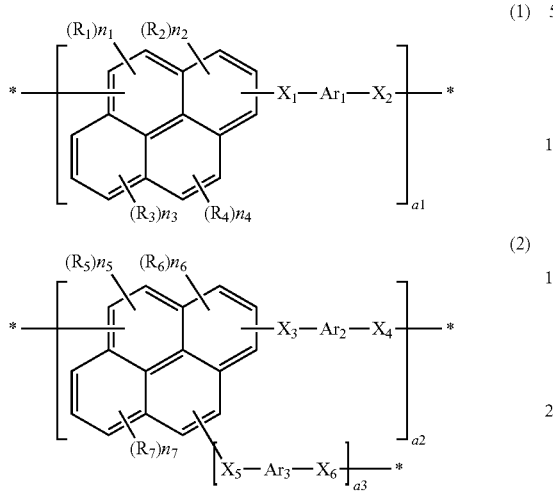

In the above Chemical Formula 1, $R_1$, $R_3$, and $R_4$ may each independently be hydrogen, a hydroxy group, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted carbonyl group, a substituted or unsubstituted amino group, a substituted or unsubstituted siloxane group, or a substituted or unsubstituted silane group, $R_2$ may be hydrogen, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted carbonyl group, a substituted or unsubstituted amino group, a substituted or unsubstituted siloxane group, or a substituted or unsubstituted silane group, and $n_1$ to $n_4$ may each independently be integers ranging from 0 to 2.

Since the polymer including the repeating unit of the above Chemical Formula 1 may be polymerized in diverse directions, compared with a polymer including a repeating unit where $R_2$ is a hydroxy group, it may form a mesh-type polymer rather than only a linear-type polymer. Therefore, since the polymer including the repeating unit represented by the above Chemical Formula 1 has an increased number of cross-linkages, the polymer may have increased etching-resistance, may be polymerized at a relatively lower temperature, may have increased solubility, and may be stable in a high-temperature environment.

In the above Chemical Formula 2, $R_5$ and $R_7$ may each independently be, e.g., hydrogen, a hydroxy group, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted carbonyl group, a substituted or unsubstituted amino group, a substituted or unsubstituted siloxane group, or a substituted or unsubstituted silane group.

$R_6$ may be, e.g., hydrogen, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted carbonyl group, a substituted or unsubstituted amino group, a substituted or unsubstituted siloxane group, or a substituted or unsubstituted silane group.

$n_1$ to $n_7$ may each independently be integers ranging from 0 to 2.

$Ar_1$ to $Ar_3$ may each independently be functional groups derived from a ring group-containing compound represented by one of the following Chemical Formulae 3 to 13.

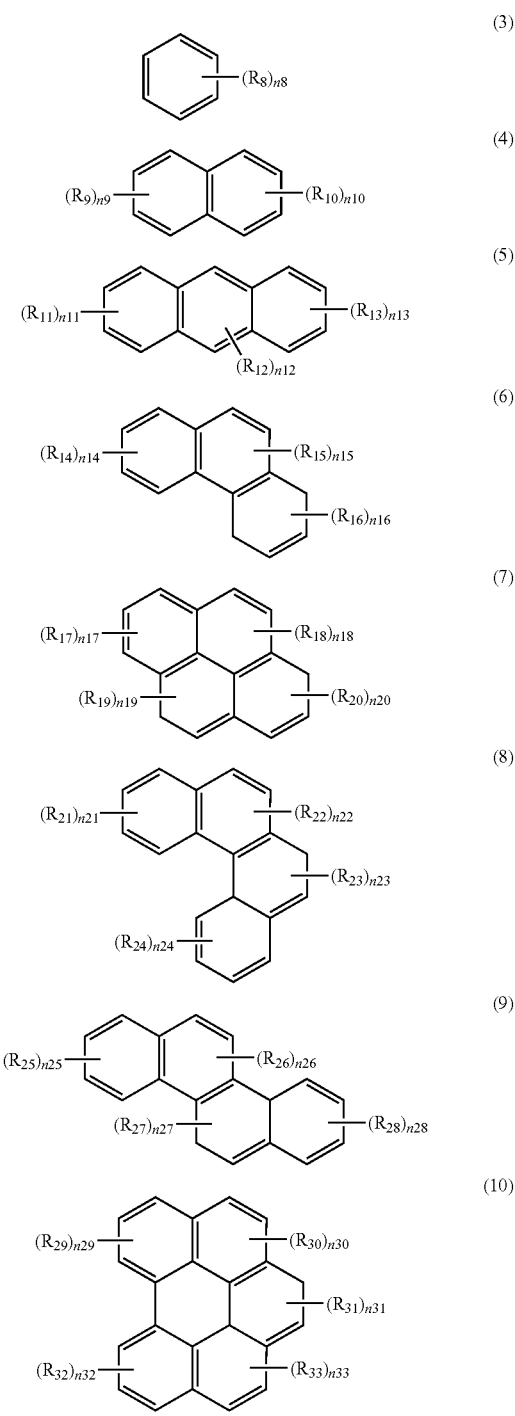

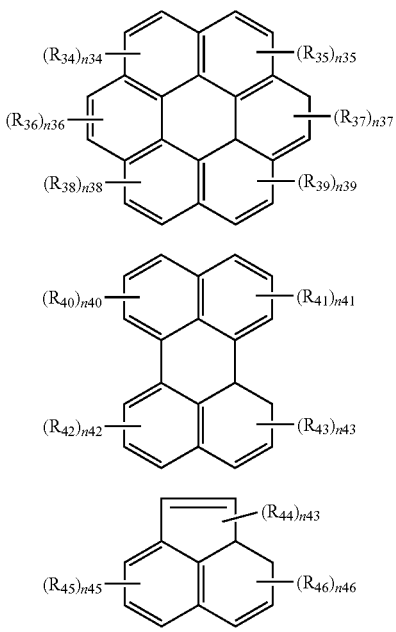

(11)

(12)

(13)

In Chemical Formulae 3 to 13, $R_8$ to $R_{33}$ and $R_{44}$ to $R_{46}$ may each independently be, e.g., hydrogen, a hydroxy group (—OH), a substituted or unsubstituted alkyl group, a substituted or unsubstituted aryl group, a substituted or unsubstituted alkenyl group, or a halogen.

$R_{34}$ to $R_{43}$ may each independently be, e.g., hydrogen, a substituted or unsubstituted alkyl group, a substituted or unsubstituted aryl group, a substituted or unsubstituted alkenyl group, or a halogen.

In the above Chemical Formulae 11 and 12, a hydroxy group or an alkoxy group may not be included as a substituent. Although a polymer may have the same structure as the above Chemical Formulae 11 and 12, polymerization may be performed in diverse directions, compared with a case where a hydroxy group or an alkoxy group is included as a substituent. Thus, a mesh-type polymer may be formed rather than only a linear-type polymer. As a result, cross-linkages may be increased; and etching-resistance may be increased. Also, polymerization may be performed at a relatively low temperature; and solubility may be increased and stability in a high-temperature environment may be acquired.

$n_8$ to $n_{46}$ may each independently range from 0 to k (where k equals a number of hydrogen atoms of each aromatic ring group).

—$X_1$— to —$X_6$— may each independently be, e.g., a functional group represented by one of the following Chemical Formulae 14 to 20.

*—$CH_2$—*  (14)

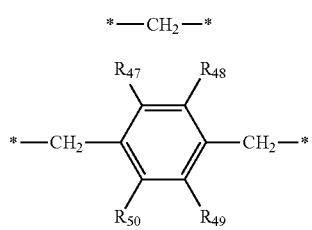

(15)

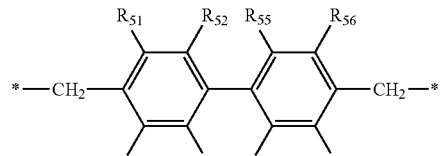

(16)

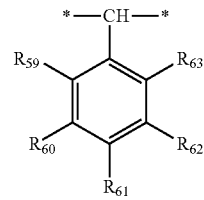

(17)

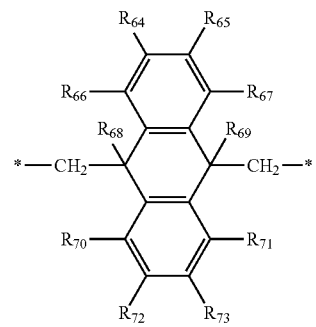

(18)

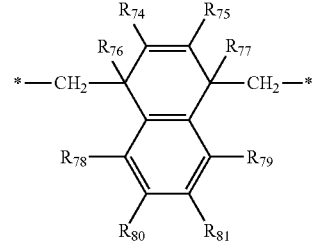

(19)

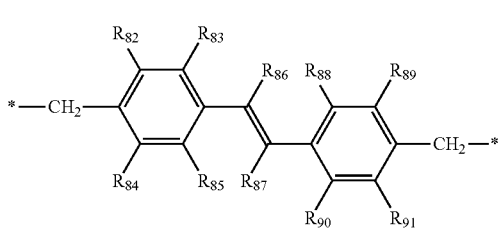

(20)

In the above Chemical Formulae 14 to 20, $R_{47}$ to $R_{91}$ may each independently be, e.g., hydrogen, a substituted or unsubstituted alkyl group, a substituted or unsubstituted aryl group, a substituted or unsubstituted allyl group, or a halogen.

The polymer according to the present embodiment may have a weight average molecular weight of about 1,000 to 30,000. Maintaining the weight average molecular weight at about 1,000 to about 30,000 may help ensure that an appropriate coating thickness and thin film may be acquired. In an implementation, the polymer may have a weight average molecular weight of about 1,000 to 10,000.

According to another embodiment, a resist underlayer composition is provided. The resist underlayer composition may include, e.g., a polymer including a repeating unit represented by at least one of Chemical Formula 1 and Chemical Formula 2 and an organic solvent.

In the resist underlayer composition, the polymer may be included in an amount of about 1 to about 30 parts by weight based on 100 parts by weight of the organic solvent. Maintaining the content of the polymer at about 1 to about 30 parts by weight may help ensure that the resist underlayer composition may be applied to form an underlayer in a target coating thickness. In an implementation, the content of the polymer may be about 1 to about 27 parts by weight based on 100 parts by weight of the organic solvent.

The organic solvent may include any suitable organic solvent in which the polymer is sufficiently soluble. In an implementation, the organic solvent may include, e.g., propyleneglycol monomethyletheracetate (PGMEA), propyleneglycol monomethylether (PGME), cyclohexanone, ethyllactate, γ-butyrolactone (GBL), acetyl acetone, and the like.

In an implementation, the resist underlayer composition according to the present embodiment may further include, e.g., a cross-linking component and/or an acid catalyst.

The cross-linking component is a material for cross-linking the repeating units of a polymer through, e.g., heating in a reaction catalyzed by a generated acid. The cross-linking component may include any suitable cross-linking agents that may react with a hydroxy group of a polymer composition by being catalyzed by a generated acid. In an implementation, the cross-linking component may include, e.g., a melamine resin, an amino resin, a glycoluril compound, and/or a bisepoxy compound.

In another implementation, the crosslinking component may include, e.g., etherified amino resins, methylated melamine resins (e.g., N-methoxymethyl-melamine resins), butylated melamine resins (e.g., N-butoxymethyl-melamine resins), methylated and butylated urea resins (e.g., Cymel U-65 Resin and UFR 80 Resin), glycoluril derivatives (e.g., Powderlink 1174) represented by the following Chemical Formula 21, and 2,6-bis(hydroxymethyl)-p-cresol. Bisepoxy-based compounds represented by the following Chemical Formula 22 and melamine-based compounds represented by the following Chemical Formula 23 may also be used as a cross-linking component.

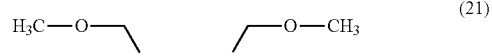
(21)

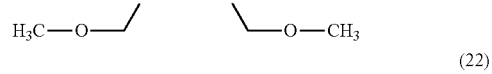
(22)

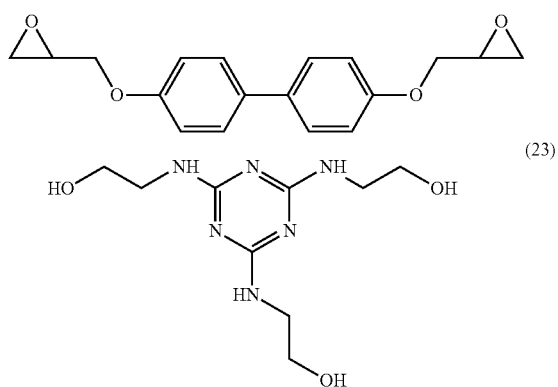
(23)

The acid catalyst may be, e.g., a heat-activated acid catalyst.

The acid catalyst may include, e.g., an organic acid, such as p-toluene sulfonic acid monohydrate, and a thermal acid generator (TAG)-based compound that has high storage stability. A heat acid generating agent is an acid generating compound that produces acid during a heat treatment. The heat acid generating agent may include, e.g., pyridinium p-toluene sulfonate, 2,4,4,6-tetrabromocyclohexadienone, benzoin tosylate, 2-nitrobenzyl tosylate, and alkylesters of organic sulfonic acids. Other photosensitive acid catalysts that are widely known in the resist technology area may be used as long as they are compatible with other components of the anti-reflective composition.

When the cross-linking component and the acid catalyst are further included, the underlayer composition according to the present embodiment may include the cross-linking component in an amount of about 0.1 to about 5 parts by weight based on 100 parts by weight of the polymer. Maintaining the amount of the cross-linking component at about 0.1 to about 5 parts by weight may help ensure that an appropriate cross-linking characteristic may be acquired while not changing the optical characteristics of the underlayer. In an implementation, the underlayer composition may include the cross-linking component in an amount of about 0.1 to about 3 parts by weight.

The acid catalyst may be included in an amount of about 0.001 to about 0.05 parts by weight based on 100 parts by weight of the polymer. In an implementation, the acid catalyst may be included in an amount of about 0.001 to about 0.03 parts by weight. Maintaining the amount of the acid catalyst at about 0.001 to about 0.05 parts by weight may help ensure that an appropriate cross-linking characteristic may be acquired and acidity affecting the preservation stability may be appropriately maintained.

The resist underlayer composition prepared according to an embodiment may further include an additive such as a surfactant. The surfactant may include, e.g., an alkylbenzenesulfonic acid salt, an alkylpyridinium salt, polyethyleneglycols, and/or a quaternary ammonium salt, but the embodiments are not limited thereto. The surfactant may be included in an amount of about 0.01 to about 1 parts by weight based on 100 parts by weight of the underlayer composition. In an implementation, the surfactant may be included in an amount of about 0.01 to about 1 part by weight based on 100 parts by weight of the underlayer composition.

Another embodiment provides a method for patterning a material. In particular, the method may include: (a) providing a material layer on a substrate; (b) forming a resist underlayer using the resist underlayer composition of an embodiment on the material layer; (c) forming a resist layer on the resist underlayer; (d) exposing the resist layer on the substrate; (e) developing the exposed substrate; and (f) etching the developed substrate.

In an implementation, prior to the formation of the resist layer, the method for patterning a material may further include forming a silicon-containing resist underlayer (second underlayer) on top of the resist underlayer (first underlayer). In another implementation, after the silicon-containing resist underlayer (second underlayer) layer is formed and prior to the forming of the resist layer, the method for patterning a material may further include forming a bottom anti-refractive coating (BARC) layer on the silicon-containing resist underlayer.

Hereinafter, a method of patterning is described in detail.

First, a material layer may be provided on a substrate.

The substrate may be a silicon substrate (e.g., wafer); and the material layer may include, e.g., a conductive, semi-conductive, magnetic, or insulating material such as aluminum, silicon nitride (SiN), and the like. The material layer may be provided using any suitable technique known in the art, and therefore its detailed description is not provided.

Then, a resist underlayer may be formed using a resist underlayer composition according to an embodiment. The resist underlayer composition may be applied at a thickness of about 500 to about 4000 Å followed by baking to provide the resist underlayer. The application may include, e.g., a spin coating process; and the baking may be performed at about 100° C. to about 300° C. for about 10 seconds to about 10 minutes.

The thickness, baking temperature, and baking time of the resist underlayer are not limited to the above conditions; and the resist underlayer may be formed to various thicknesses, at various baking temperatures, and for various baking times by a person skilled in this art without specific technical features.

A resist layer (a radiation-sensitive imaging layer) may be formed on the resist underlayer. Since the resist layer may be formed through a generally known process of applying a photosensitive resist composition and performing a baking process, further detailed description thereof is omitted.

Before the resist layer is formed, a process of forming a silicon-containing resist underlayer may be performed and/or a process of forming a bottom anti-refractive coating layer on the silicon-containing resist underlayer may be performed. Since formation of the silicon-containing resist underlayer and formation of the anti-reflective coating layer are widely known to those skilled in the art to which the present invention pertains to, further detailed description thereof is omitted.

Then, the resist layer may be exposed. For the exposure process, diverse exposure light sources may be used, e.g., ArF, KrF, extreme ultraviolet rays (EUV), and/or an E-beam. When the exposure is completed, a baking process may be performed to induce a chemical reaction in the exposed region. The baking process may be performed at a temperature of about 150° C. to about 500° C. for about 60 to about 90 seconds.

Then, a development process may be performed. The development process may be performed using a basic aqueous solution. In an implementation, the basic aqueous solution development solution may include, e.g., a tetramethylammonium hydroxide (TMAH) aqueous solution.

In the development process, the resist layer and the resist underlayer may be selectively removed and thus a portion of the material layer may be exposed.

Then, an etching process may be performed. Through the etching process, the exposed material layer may be etched to thereby form a pattern. The etching process may be performed using an etching gas. In an implementation, the etching gas may include, e.g., plasma of a halogen gas, plasma of a fluorocarbon gas, such as $CHF_3$ and $CF_4$, and/or plasma of a chloride gas such as $BCl_3$ or $Cl_2$. Then, the resist layer and the resist underlayer remaining on the substrate may be removed using a stripper to thereby form a desired pattern.

Through the process described above, a semiconductor integrated circuit device may be provided.

The composition and lithographic structure prepared according to an embodiment may be used for manufacturing and designing an integrated circuit device according to a semiconductor manufacturing process. For example, the composition and lithographic structure prepared according to an embodiment may be used for forming patterned material layer structures, such as a metal line, a hole for contact or bias, an insulation section, e.g., a damascene trench (DT) or shallow trench isolation (STI) structure, and a trench for a capacitor structure. Also, it is understood to those skilled in the art that the concept and scope of the embodiments are not limited to a specific lithographic method or device structure.

Hereinafter, the embodiments will be described in more detail with reference to examples. However, they are exemplary embodiments and are not limiting. Moreover, the Comparative Examples are set forth to highlight certain characteristics of certain embodiments and are not to be construed as either limiting the scope of the invention as exemplified in the Examples or as necessarily always being outside the scope of the invention in every respect.

EXAMPLE 1

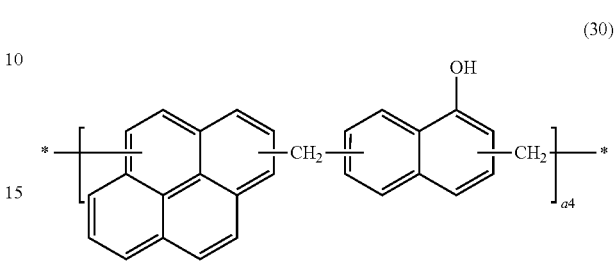

(30)

A 500 ml 3-neck flask was equipped with a thermometer, a condenser, and a mechanical agitator. The 3-neck flask was placed in an oil thermostat set to 90 to 100° C. The thermostat was put on a hot plate and agitated with a stirring bar while maintaining a constant temperature. The cooling water temperature of the condenser was set to 5° C.

28.32 g of 0.14 mol pyrene, 28.83 g of 0.2 mol 2-naphthol, and 12.08 g of 0.4 mol paraformaldehyde were put into the 3-neck flask. Subsequently, 0.57 g of 3 mmol p-toluene sulfonic acid monohydrate was dissolved in 163 g of propyleneglycol monomethyletheracetate (PGMEA); and the solution was put into the 3-neck flask and agitated for 17.5 hours for polymerization to thereby acquire a polymerization reactant.

Reactant samples were collected from the polymerization reactant on an hourly basis, and a weight average molecular weight of each reactant sample was measured. When the weight average molecular weight was about 2500 to about 3500, the reaction was completed. Herein, the weight average molecular weight was measured by collecting 1 g of reactant sample from the polymerization reactant, quenching the collected reactant sample to room temperature, collecting 0.02 g of the quenched reactant sample, diluting the quenched reactant sample with a THF solvent until a solid concentration became 4 wt %, and measuring the weight average molecular weight of the acquired diluted solution.

After the polymerization reaction was completed, the reactant was slowly cooled to room temperature.

The reactant was put into 40 g of distilled water and 400 g of methanol, strongly agitated, and allowed to stand. The supernatant was removed, and the precipitate was dissolved in 80 g of propyleneglycol monomethyletheracetate (PGMEA) and then fiercely agitated in 320 g of methanol, and let stand (primary process). The acquired supernatant was removed again, and the precipitate was dissolved in 80 g of PGMEA (secondary process). The primary process and secondary process are referred to as a one-time refining process, and the one-time refining process was performed 3 times in total. A polymer acquired after the refining process was dissolved in 80 g of PGMEA; and the methanol and the distilled water remaining in the solution were removed under reduced pressure.

The weight average molecular weight and polydispersity of the acquired polymer were measured by gel permeation chromatography in the presence of tetrahydrofuran. The polymer represented by the above Chemical Formula 30 had a weight average molecular weight of 4,000, a polydispersity of 1.75, and a4=11.

EXAMPLE 2

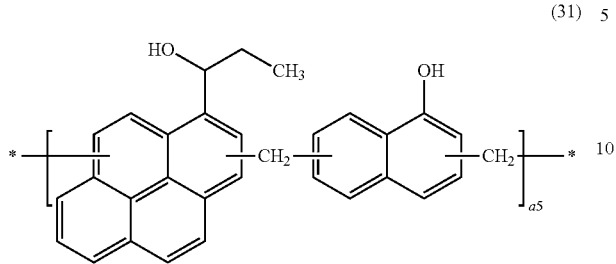

(31)

A polymer represented by Chemical Formula 31 and having a weight average molecular weight of 2000, a polydispersity of 1.38, and a5=5, was prepared according to the same method as Example 1, except that instead of 28.32 g of 0.14 mol pyrene, 36.45 g of 0.14 mol 1,1-ethyl pyrenyl methanol was added to the reactor, i.e., the 3-neck flask.

EXAMPLE 3

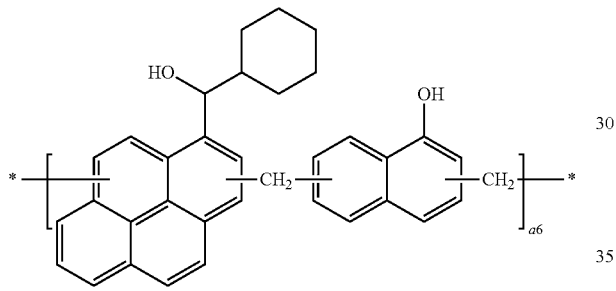

(32)

A polymer represented by Chemical Formula 32 and having a weight average molecular weight of 3,200, a polydispersity of 1.67, and a6=8, was prepared according to the same method as Example 1, except that instead of 28.32 g of 0.14 mol pyrene, 44.02 g of 0.14 mol 1,1-cyclohexyl pyrenyl methanol was added to the reactor, i.e., the 3-neck flask.

EXAMPLE 4

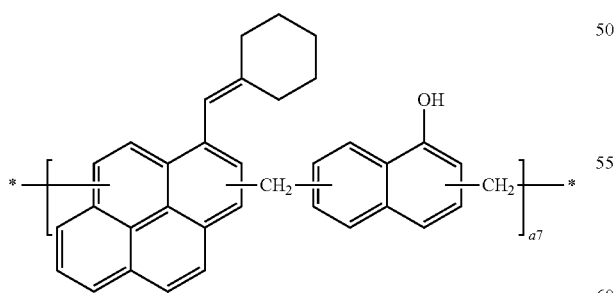

(33)

A polymer represented by Chemical Formula 33 and having a weight average molecular weight of 3,100, a polydispersity of 1.63, and a7=8, was prepared according to the same method as Example 1, except that instead of 28.32 g of 0.14 mol pyrene, 41.50 g of 0.14 mol 1-pyrenyl methylene cyclohexane was added to the reactor, i.e., the 3-neck flask.

EXAMPLE 5

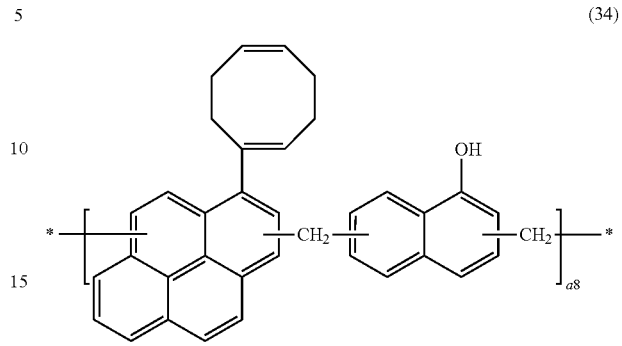

(34)

A polymer represented by Chemical Formula 34 and having a weight average molecular weight of 2,800, a polydispersity of 1.52, and a8=6, was prepared according to the same method as Example 1, except that instead of 28.32 g of 0.14 mol pyrene, 43.18 g of 0.14 mol 1,5-cyclooctadiene pyrene was added to the reactor, i.e., the 3-neck flask.

EXAMPLE 6

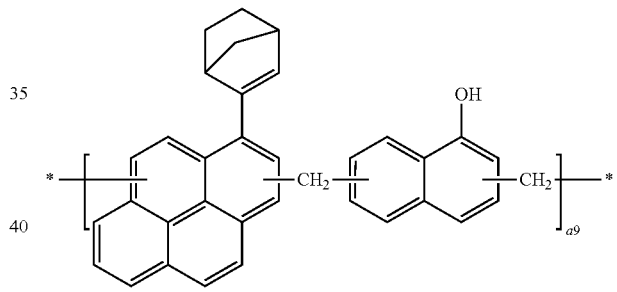

(35)

A polymer represented by Chemical Formula 35 and having a weight average molecular weight of 3,700, a polydispersity of 1.85, and a9=8, was prepared according to the same method as Example 1, except that instead of 28.32 g of 0.14 mol pyrene, 41.21 g of 0.14 mol norbornyl pyrene was added to the reactor, i.e., the 3-neck flask.

EXAMPLE 7

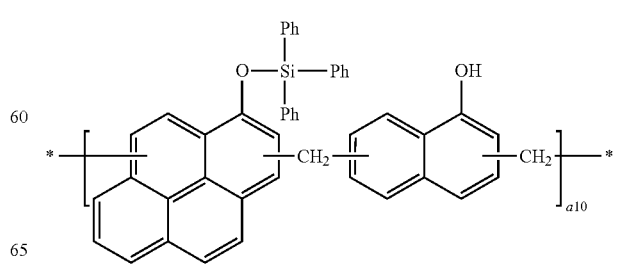

(36)

A polymer represented by Chemical Formula 36 and having a weight average molecular weight of 4,700, a polydispersity of 1.92, and a10=10, was prepared according to the same method as Example 1, except that instead of 28.32 g of 0.14 mol pyrene, 95.33 g of 0.2 mol triphenylpyrenyloxy silane was added to the reactor, i.e., the 3-neck flask.

COMPARATIVE EXAMPLE 1

Polymer of fluorenylidene diphenol and α,α'-dichloro-p-xylene (37)

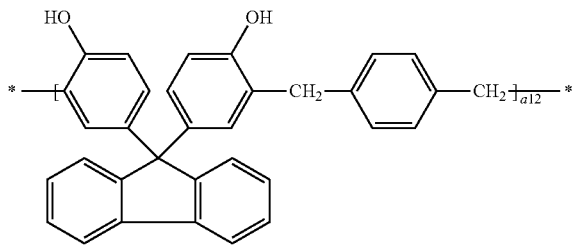

While nitrogen gas flowed into a 1 L 4-neck flask equipped with a condenser, a mechanical agitator, a 300 ml dropping funnel, and a nitrogen gas introduction tube, 8.75 g (0.05 mol) of α,α'-dichloro-p-xylene, 26.66 g of aluminum chloride, and 200 g of γ-butyrolactone were put into the 4-neck flask and then agitated.

After 10 minutes, a solution prepared by dissolving 35.03 g (0.10 mol) of 4,4'-(9-fluorenylidene)diphenol in 200 g of γ-butyrolactone was slowly dripped into the acquired mixed solution for 30 minutes and then agitated at 110 to 120° C. for 13.5 hours to thereby induce polymerization. After the reaction ended, acid was removed using water and condensed using an evaporator. Then, a polymerization product was diluted using methylamylketone and methanol, and then the concentration was adjusted by adding 15 wt % of a methylamylketone/methanol solution prepared in a weight ratio of 4/1. The solution was put into a 3 L separatory funnel, and n-heptane was added to the 3 L separatory funnel to thereby remove low molecular weight materials including a monomer to thereby produce a polymer represented by the above Chemical Formula 37 and having a weight average molecular weight of 12,000, polydispersity of 2.0, and a12=26.

COMPARATIVE EXAMPLE 2

Copolymer of 1-hydroxypyrene,
1,4-bismethoxymethylbenzene,
9,9'-bis(phenol)fluorene, and
1,4-bismethoxymethylbenzene A 2000 ml 3-neck flask was equipped with a thermometer, a condenser, a mechanical agitator, and a dropping funnel. The 3-neck flask was placed in an oil chamber set to a temperature of 130 to 150° C. The oil chamber was put on a hot plate, and agitated with a stirring bar while being heated. The cooling water temperature of the condenser was set to 40° C.

65.48 g of 1 mol 1-hydroxypyrene and 103.12 g of 9,9'-bis(phenol)fluorene were added to the 3-neck flask, and 270.34 g of propyleneglycol monomethyletheracetate (PGMEA) was added thereto and dissolved. 4.62 g of 0.05 mol diethylsulfate (DS) was added to the acquired product.

199.48 g of 2.0 mol 1,4-bismethoxymethylbenzene (MMB) was applied to a dropping funnel, and when the temperature of the 3-neck flask reached 130° C., MMB was added very slowly to the 3-neck flask for 1.5 hours.

Accordingly, a polymerization reaction proceeded, and samples were collected on an hourly basis and their weight average molecular weights were measured. When the measured weight average molecular weight was between 2500 and 3500, the polymerization reaction was completed. Herein, the samples for measuring the molecular weight were prepared by collecting 1 g of a reactant sample, quenching the collected reactant samples to room temperature, collecting 0.02 g of the quenched reactant samples, and diluting the quenched reactant samples in a THF solvent until the solid concentration became 4 wt %.

To terminate the reaction at a predetermined moment, 4.48 g of 0.03 mol triethanolamine was added to the 3-neck flask as a neutralization agent and agitated. Then, the reactant was slowly cooled to room temperature.

A polymer solution was prepared by diluting the reactant with 500 g of PGMEA. Then, the polymer solution was added to a 2,000 ml reparatory funnel. 4 kg of an alcohol mixture of methanol:ethyleneglycol in a g/g ratio of 90:10 was prepared.

The synthesized polymer solution was added dropwise into the alcohol mixture while fiercely agitating the alcohol mixture. As a result, a target product, which was the polymer, was collected at the bottom of the flask, and the supernatant was separated and put aside. After the supernatant was removed, rotation evaporation was performed at 60° C. for 10 minutes to thereby remove methanol from the final reactant and acquire a copolymer.

The molecular weight and polydispersity of the acquired copolymer were measured with GPC in the presence of tetrahydrofuran. The copolymer was represented by the following Chemical Formula 38 and had a weight average molecular weight of 12,000, a polydispersity of 2.3, a13=8 to 9, and a14=6 to 7.

(38)

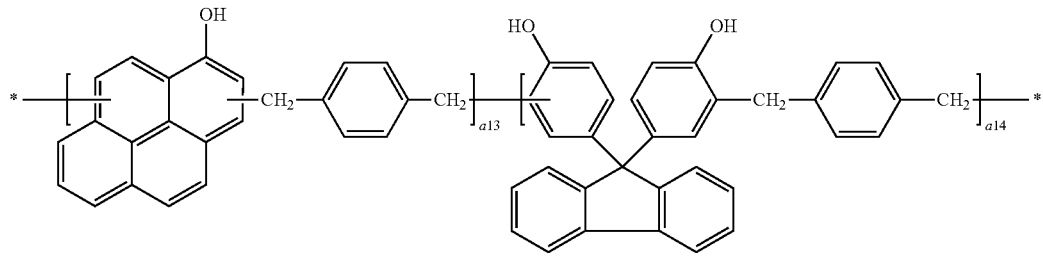

Preparation of Resist Underlayer Composition

Resist underlayer compositions were prepared by weighing 0.8 g of the respective polymers prepared according to Examples 1 to 8 and Comparative Examples 1 and 2, adding each polymer to a solution obtained by dissolving 0.2 g of a glycoluril derivative cross-linking agent (Powderlink 1174) which is represented by the following Chemical Formula 21 and 2 mg of pyridinium p-toluene sulfonate in 9 g of PGMEA, and performing filtration.

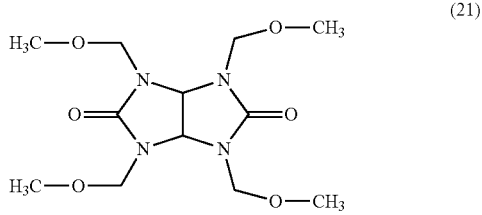
(21)

Assessment of Optical Properties

The resist underlayer compositions prepared according to Examples 1 to 8 and Comparative Examples 1 and 2 were respectively applied to silicon wafers through a spin-coating method, and the silicon wafers coated with the resist underlayer compositions were baked at 240° C. for 60 seconds to thereby form films each having a thickness of 3,000 Å.

Refractive indices (n) and extinction coefficients (k) of the films were measured using an ellipsometer (J. A. Woollam). The results were as shown in Table 1.

TABLE 1

| Sample used for film fabrication | Optical properties (193 nm) | | Optical properties (248 nm) | |
|---|---|---|---|---|
| | n (refractive index) | k (extinction coefficient) | n (refractive index) | k (extinction coefficient) |
| Comparative Example 1 | 1.43 | 0.75 | 2.32 | 0.26 |
| Comparative Example 2 | 1.44 | 0.70 | 1.97 | 0.27 |
| Example 1 | 1.45 | 0.55 | 2.04 | 0.64 |
| Example 2 | 1.48 | 0.54 | 1.98 | 0.67 |
| Example 3 | 1.46 | 0.47 | 1.95 | 0.57 |
| Example 4 | 1.46 | 0.46 | 1.93 | 0.54 |
| Example 5 | 1.46 | 0.48 | 1.99 | 0.58 |
| Example 6 | 1.45 | 0.43 | 1.89 | 0.50 |
| Example 7 | 1.46 | 0.63 | 1.94 | 0.49 |
| Example 8 | 1.47 | 0.61 | 1.98 | 0.52 |

As a result of the optical property assessment shown in Table 1, the resist underlayer compositions of Examples 1 to 8 turned out to have levels of refractive index and absorption appropriate for use as anti-reflective layers in the wavelength regions of ArF 193 nm and KrF 248 nm. Accordingly, reflectivity between the resist and the underlayer may be minimized. On the other hand, the resist underlayer compositions of Comparative Examples 1 and 2 exhibited somewhat appropriate levels of refractive index in the wavelength region of ArF 193 nm and KrF 248 nm. However, since their extinction coefficients were too high (e.g., 0.75) or too low (e.g., 0.26), they were not appropriate for an anti-reflective layer and their resolutions were decreased.

Application to Resist Underlayer

EXAMPLES 9 TO 16

Underlayers of Examples 9 to 16 having a thickness of 3000 Å were formed by coating the upper surfaces of aluminum-plated silicon wafers with the resist underlayer compositions of Examples 1 to 8 through a spin-coating method and baking the coated silicon wafers at 240° C. for 60 seconds.

COMPARATIVE EXAMPLES 3 AND 4

Underlayers of Comparative Examples 3 and 4 having a thickness of 3000 Å were formed by coating the upper surfaces of aluminum-plated silicon wafers with the resist underlayer compositions of Comparative Examples 1 and 2 through a spin-coating method and baking the coated silicon wafers at 240° C. for 60 seconds.

Assessment of Pattern Properties

Upper surfaces of the underlayers prepared according to Examples 9 to 16 and Comparative Examples 3 and 4 were coated with a photosensitive resist for KrF, baked at 110° C. for 60 seconds, exposed using exposure equipment the ASML company (XT:1400, NA 0.93), and developed using a 2.38 wt % tetramethylammonium hydroxide (TMAH) aqueous solution. Then, 90 nm line and space patterns were observed with a field emission scanning electron microscope (FE-SEM). That is, an exposed latitude (EL) margin according to variation of the exposure amount and depth of focus (DoF) margin according to variation of the distance from a light source were observed, and the results were recorded in the following Table 2.

TABLE 2

| | Pattern properties | | |
|---|---|---|---|
| Underlayer for pattern | EL margin (ΔmJ/exposure energy mJ) | DoF margin (μm) | Profile |
| Comparative Example 3 | 0.1 | 0.1 | Undercut |
| Comparative Example 4 | 0.3 | 0.3 | Undercut |
| Example 9 | 0.3 | 0.4 | Cubic |
| Example 10 | 0.4 | 0.4 | Cubic |
| Example 11 | 0.4 | 0.5 | Cubic |
| Example 12 | 0.3 | 0.3 | Cubic |
| Example 13 | 0.4 | 0.5 | Cubic |
| Example 14 | 0.4 | 0.3 | Cubic |
| Example 15 | 0.3 | 0.4 | Cubic |
| Example 16 | 0.3 | 0.3 | Cubic |

Referring to the assessment results, the patterns of Examples 9 to 16 showed fine results in terms of pattern profile or margins. However, for the patterns of Comparative Examples 3 and 4, an under-cut pattern profile appeared and the EL margin and the DoF margin were relatively low. It is considered that the results originated from the difference in absorption characteristics in the wavelength of ArF (196 nm).

Assessment of Etching

Dry etching was performed on each underlayer prepared according to Examples 9 to 16 and Comparative Examples 3 and 4 by using a mixed gas of $CHF_3$ and $CF_4$, and then dry etching was again performed using a mixed gas of $BCl_3$ and $Cl_2$.

Finally, all the remaining organic materials were removed using oxygen ($O_2$) gas; and cross-sections were observed with FE-SEM. The observation results were as shown in Table 3.

TABLE 3

| Underlayer for pattern | Pattern profile after etching |
|---|---|
| Comparative Example 3 | Tapered, coarse surface |
| Comparative Example 4 | Tapered |
| Example 9 | Vertical |
| Example 10 | Vertical |
| Example 11 | Vertical |
| Example 12 | Vertical |
| Example 13 | Vertical |
| Example 14 | Vertical |
| Example 15 | Vertical |
| Example 16 | Vertical |

As a result of the etching assessment, shown in Table 3, the underlayers of Examples 9 to 16 showed fine etching profiles and selectivity. However, in the case of the underlayers of Comparative Examples 3 and 4, tapered pattern shape appeared after etching, and it is considered that the results originated from insufficient selectivity in the corresponding etching condition.

The underlayer composition of an embodiment may be easy to apply to substrates without high cost application methods, e.g., chemical and physical vapor deposition, special solvents, and/or high-temperature baking. Indeed, the underlayer composition of an embodiment may be applied by, e.g., spin-coating techniques without high temperature baking. The underlayer composition of an embodiment may be selectively etched using an overlying resist layer as a mask in an easy manner while being resistant to etching used to pattern an underlying metal layer using an underlayer as a mask.

The underlayer composition of an embodiment may provide superior storage life-span properties and may avoid unwanted interactions (e.g., acid pollution from a hardmask) with an imaging resist layer. The underlayer composition of an embodiment may have particular optical properties against imaging irradiation at short wavelengths (e.g., 157 nm, 193 nm, and 248 nm).

Since the polymer prepared according to an embodiment may have a refractive index and absorption of an appropriate range as an anti-reflective layer in a DUV wavelength region such as ArF (193 nm) and KrF (248 nm), it may minimize reflectivity between the resist and the underlayer. Also, since the polymer prepared according to an embodiment may have high etching selectivity during a lithographic process and sufficient resistance against multiple etching, it may provide an excellent lithographic structure in terms of pattern profile or margins.

Also, the polymer prepared according to an embodiment may provide an excellent optical characteristic, mechanical characteristic, and etching selectivity characteristic, and may be applied through a spin-on coating method. Thus, the polymer prepared according to an embodiment may be useful for a lithographic process of a short wavelength and may have a minimal amount of remaining acid.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A resist underlayer polymer, comprising a repeating unit represented by at least one of Chemical Formula 1 and Chemical Formula 2:

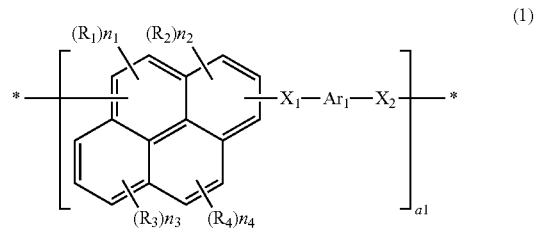

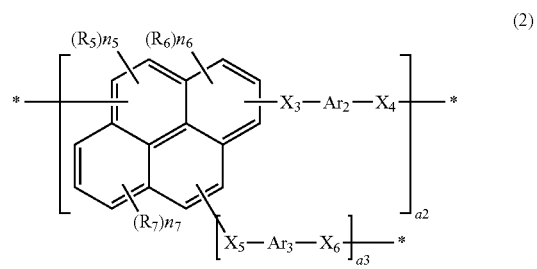

wherein, in Chemical Formulae 1 and 2, $R_1$, $R_3$, $R_4$, $R_5$, and $R_7$ are each independently hydrogen, a hydroxy group, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted aldehyde group, a substituted or unsubstituted amino group, a substituted or unsubstituted siloxane group, or a substituted or unsubstituted silane group, $R_2$ and $R_6$ are each independently hydrogen, a halogen, a substituted or unsubstituted alkyl group, a substituted or unsubstituted aryl group, a substituted or unsubstituted allyl group, a substituted or unsubstituted heteroaryl group, a substituted or unsubstituted aldehyde group, a substituted or unsubstituted siloxane group, or a substituted or unsubstituted silane group, $n_1$ to $n_7$ are each independently integers ranging from 0 to 2, and $2 \leq a1 < 100$, $2 \leq a2 < 100$, and $2 \leq a3 < 100$, and $Ar_1$ to $Ar_3$ are each independently a functional group derived from an aromatic ring group-containing compound represented by Chemical Formulae 4 to 13:

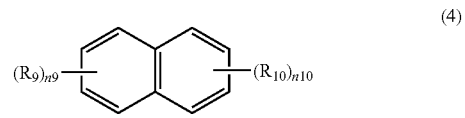

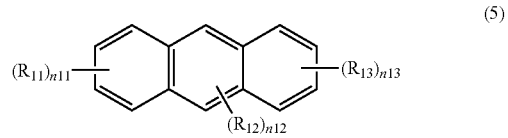

-continued

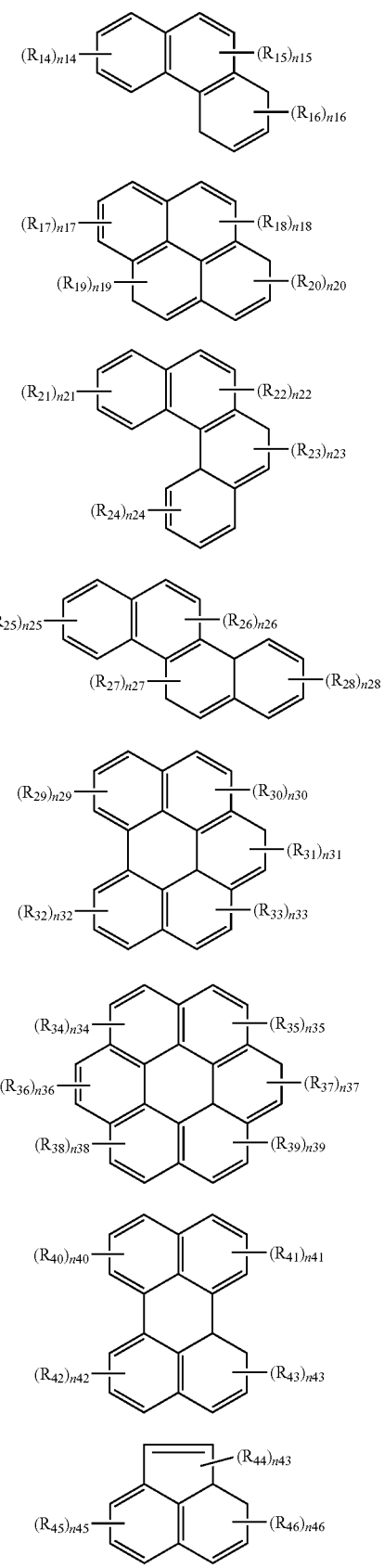

wherein, in Chemical Formulae 4 to 13, $R_9$ to $R_{33}$ and $R_{44}$ to $R_{46}$ are each independently hydrogen, a hydroxy group (—OH), a substituted or unsubstituted alkyl group, a substituted or unsubstituted aryl group, a substituted or unsubstituted alkenyl group, or a halogen, $R_{34}$ to $R_{43}$ are each independently hydrogen, a substituted or unsubstituted alkyl group, a substituted or unsubstituted aryl group, a substituted or unsubstituted alkenyl group, or a halogen, and n9 to n46 are each independently from 0 to k, wherein k is a maximum number of hydrogen atoms that can bond to each aromatic ring group, —$X_1$— to —$X_6$— are each independently a functional group represented by one of Chemical Formulae 14 to 20:

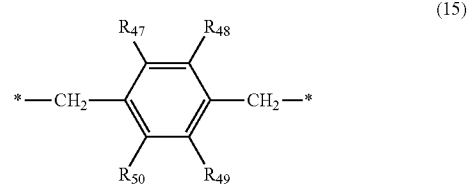

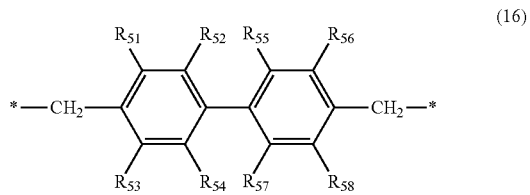

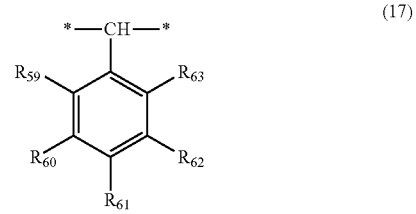

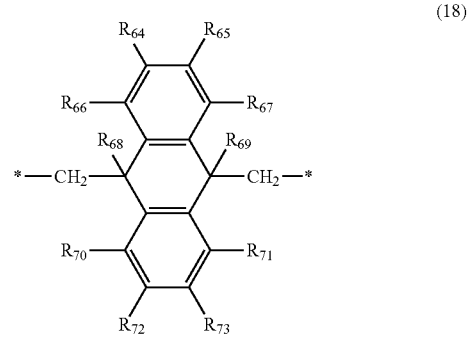

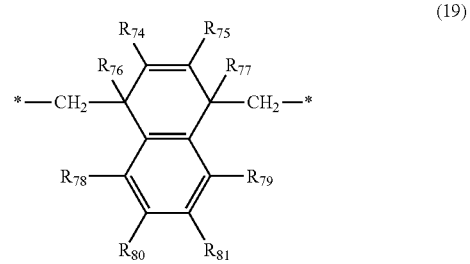

-continued

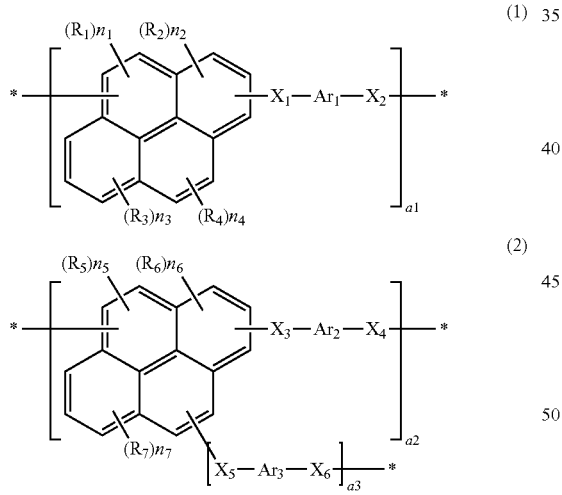

wherein, in Chemical Formulae 14 to 20, $R_{47}$ to $R_{91}$ are each independently hydrogen, a substituted or unsubstituted alkyl group, a substituted or unsubstituted aryl group, a substituted or unsubstituted allyl group, or a halogen.

2. The resist underlayer polymer as claimed in claim 1, wherein
$R_1$ to $R_7$ are hydrogen, $Ar_1$ to $Ar_3$ are each independently a functional group derived from an aromatic ring group-containing compound represented by Chemical Formula 4, and
—$X_1$— to —$X_6$— are each functional groups represented by Chemical Formula 14.

3. The resist underlayer polymer as claimed in claim 1, wherein the polymer has a weight average molecular weight of 1,000 to 30,000.

4. A resist underlayer composition comprising
an organic solvent; and
a polymer including a repeating unit represented by at least one of Chemical Formula 1 and Chemical Formula 2,

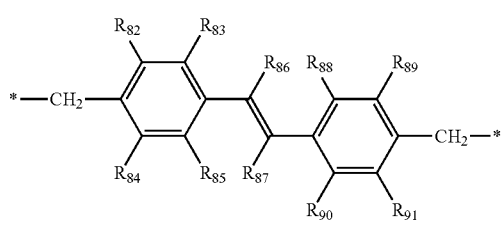

wherein, in Chemical Formulae 1 and 2,
$R_1$, $R_3$, $R_4$, $R_5$, and $R_7$ are each independently hydrogen, a hydroxy group, a halogen, a substituted or unsubstituted alkyl group, a substituted or unsubstituted aryl group, a substituted or unsubstituted allyl group, a substituted or unsubstituted heteroaryl group, a substituted or unsubstituted alkoxy group, a substituted or unsubstituted aldehyde group, a substituted or unsubstituted amino group, a substituted or unsubstituted siloxane group, or a substituted or unsubstituted silane group,
$R_2$ and $R_6$ are each independently hydrogen, a halogen, a substituted or unsubstituted alkyl group, a substituted or unsubstituted aryl group, a substituted or unsubstituted allyl group, a substituted or unsubstituted heteroaryl group, a substituted or unsubstituted aldehyde group, a substituted or unsubstituted siloxane group, or a substituted or unsubstituted silane group, $n_1$ to $n_7$ are each independently integers ranging from 0 to 2, and $2 \le a1 < 100$, $2 \le a2 < 100$, and $2 \le a3 < 100$, and $Ar_1$ to $Ar_3$ are each independently a functional group derived from an aromatic ring group-containing compound represented by Chemical Formulae 4 to 13:

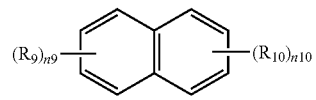

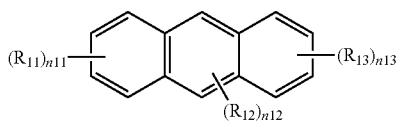

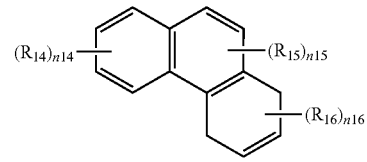

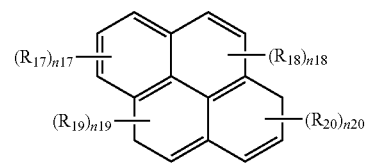

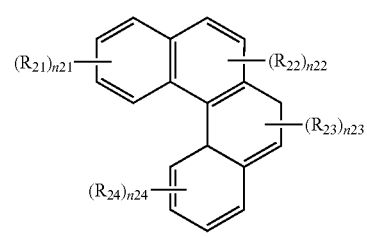

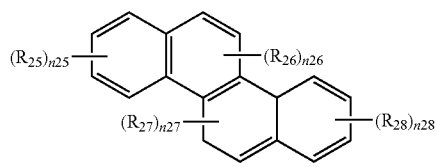

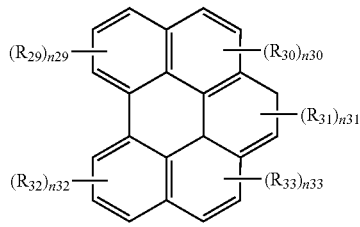

31

-continued

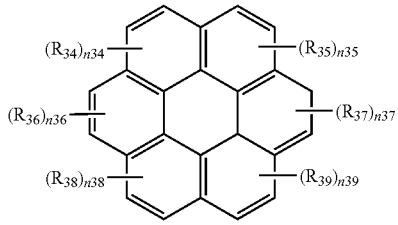

(11)

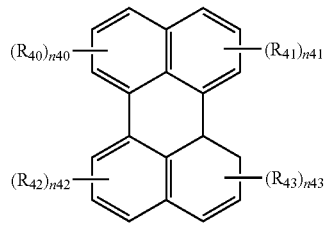

(12)

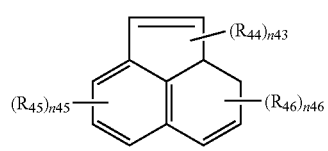

(13)

wherein, in Chemical Formulae 4 to 13, $R_9$ to $R_{33}$ and $R_{44}$ to $R_{46}$ are each independently hydrogen, a hydroxy group (—OH), a substituted or unsubstituted alkyl group, a substituted or unsubstituted aryl group, a substituted or unsubstituted alkenyl group, or a halogen, $R_{34}$ to $R_{43}$ are each independently hydrogen, a substituted or unsubstituted alkyl group, a substituted or unsubstituted aryl group, a substituted or unsubstituted alkenyl group, or a halogen, and n9 to n46 are each independently from 0 to k, wherein k is a maximum number of hydrogen atoms that can bond to each aromatic ring group, —$X_1$— to —$X_6$— are each independently a functional group represented by one of Chemical Formulae 14 to 20:

(14)

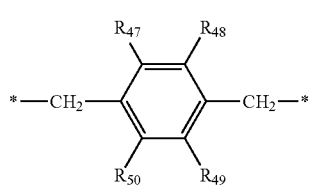

(15)

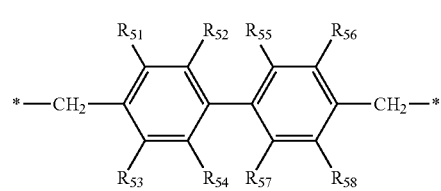

(16)

32

-continued

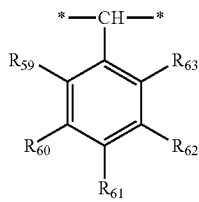

(17)

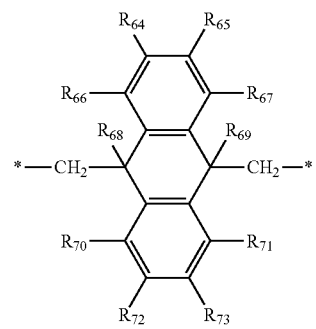

(18)

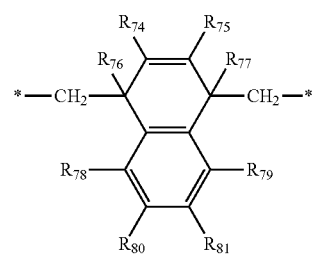

(19)

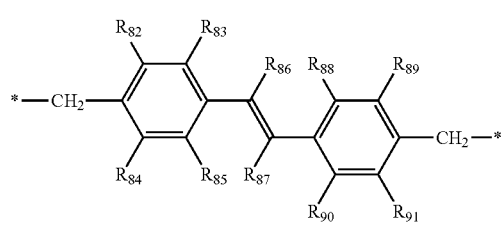

(20)

wherein, in Chemical Formulae 14 to 20, $R_{47}$ to $R_{91}$ are each independently hydrogen, a substituted or unsubstituted alkyl group, a substituted or unsubstituted aryl group, a substituted or unsubstituted allyl group, or a halogen.

5. The resist underlayer composition as claimed in claim 4, wherein:
   $R_1$ to $R_7$ are hydrogen,
   $Ar_1$ to $Ar_3$ are each independently a functional group derived from an aromatic ring group-containing compound represented by Chemical Formula 4, and
   —$X_1$— to —$X_6$— are functional groups represented by Chemical Formula 14.

6. The resist underlayer composition as claimed in claim 4, wherein the polymer has a weight average molecular weight of 1,000 to 30,000.

7. The resist underlayer composition as claimed in claim 4, wherein the polymer is included in an amount of about 1 to about 30 parts by weight, based on 100 parts by weight of the organic solvent.

8. The resist underlayer composition as claimed in claim 4, wherein the polymer is included in an amount of about 1 to about 27 parts by weight, based on 100 parts by weight of the organic solvent.

9. The resist underlayer composition as claimed in claim 4, further comprising:
   a cross-linking component; and
   an acid catalyst.

10. The resist underlayer composition as claimed in claim 9, wherein the cross-linking component includes a melamine resin, an amino resin, a glycoluril compound, a bisepoxy compound, or a combination thereof.

11. The resist underlayer composition as claimed in claim 9, wherein the cross-linking component is included in an amount of about 0.1 to about 5 parts by weight, based on 100 parts by weight of the polymer.

12. The resist underlayer composition as claimed in claim 9, wherein the acid catalyst includes pyridinium p-toluene sulfonate, 2,4,4,6-tetrabromocyclohexadienone, benzointosylate, 2-nitrobenzyltosylate, alkylesters of organic sulfonic acids, or a combination thereof.

13. The resist underlayer composition as claimed in claim 9, wherein the acid catalyst is included in an amount of about 0.001 to about 0.05 parts by weight, based on 100 parts by weight of the polymer.

14. The resist underlayer composition as claimed in claim 4, further comprising a surfactant.

15. A method for patterning a device, the method comprising:
   providing a material layer on a substrate;
   forming a resist underlayer using the resist underlayer composition according to claim 4 on the material layer;
   forming a resist layer on the resist underlayer;
   exposing the resist layer on the substrate;
   developing the exposed substrate; and
   etching the developed substrate.

16. The method as claimed in claim 15, wherein the method further comprises forming a silicon-containing resist underlayer prior to forming the resist layer.

17. The method as claimed in claim 16, wherein the method further comprises forming a bottom antireflective coating (BARC) on the silicon-containing resist underlayer prior to forming the resist layer.

18. The method as claimed in claim 15, wherein the method of patterning a device is a method of manufacturing a semiconductor integrated circuit device.

* * * * *